(12) United States Patent
Licht

(10) Patent No.: US 7,557,442 B2
(45) Date of Patent: Jul. 7, 2009

(54) POWER SEMICONDUCTOR ARRANGEMENT

(75) Inventor: Thomas Licht, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 442 days.

(21) Appl. No.: 11/107,225

(22) Filed: Apr. 15, 2005

(65) Prior Publication Data

US 2005/0230820 A1    Oct. 20, 2005

(30) Foreign Application Priority Data

Apr. 16, 2004   (DE) .................. 10 2004 018 476

(51) Int. Cl.
*H01L 23/34* (2006.01)
(52) U.S. Cl. ............... 257/720; 257/717; 257/718; 257/719; 257/712; 257/675; 257/678; 257/690; 257/E23.104; 257/E25.016
(58) Field of Classification Search ............ 257/705, 257/720, 177, 706, 717–719, 712, 675, 678, 257/690, E23.104, E25.016
See application file for complete search history.

(56) References Cited

U.S. PATENT DOCUMENTS

| | | | | |
|---|---|---|---|---|
| 5,296,739 A * | 3/1994 | Heilbronner et al. | ........ | 257/687 |
| 5,705,853 A * | 1/1998 | Faller et al. | ........ | 257/719 |
| 5,856,913 A | 1/1999 | Heilbronner | ........ | 361/760 |
| 6,087,682 A * | 7/2000 | Ando | ........ | 257/178 |
| 6,881,071 B2 * | 4/2005 | Heilbronner | ........ | 439/67 |
| 2002/0173192 A1 | 11/2002 | Heilbronner | ........ | 439/329 |
| 2004/0164388 A1 | 8/2004 | Stolze | ........ | 257/678 |
| 2004/0217465 A1 | 11/2004 | Stolze | ........ | 257/706 |
| 2005/0032347 A1 | 2/2005 | Hase et al. | ........ | 438/612 |

FOREIGN PATENT DOCUMENTS

| | | |
|---|---|---|
| DE | 19617055 C1 | 6/1997 |
| DE | 69413160 | 2/1999 |
| DE | 69413160 T2 | 2/1999 |
| DE | 19903875 | 8/2000 |
| DE | 19903875 A1 | 8/2000 |
| DE | 19942915 | 3/2001 |
| DE | 19942915 A1 | 3/2001 |
| DE | 10121970 A1 | 11/2002 |
| DE | 10142971 A1 | 3/2003 |
| DE | 10149886 A1 | 4/2003 |
| WO | 03/030247 A2 | 4/2003 |

* cited by examiner

*Primary Examiner*—Lynne Gurley
*Assistant Examiner*—Junghwa M Im
(74) *Attorney, Agent, or Firm*—Coats & Bennett, P.L.L.C.

(57) ABSTRACT

A power semiconductor arrangement has an electrically insulating and thermally conductive substrate, which is provided with structured metallization on at least one side, a cooling device which is in thermal contact with the other side of the substrate, at least one semiconductor component which is arranged on the substrate and is electrically connected to the structured metallization, an entirely or partially electrically insulating film which is arranged at least on that side of the substrate at which the at least one semiconductor component is placed, and which is laminated without any cavities onto the substrate including or excluding the at least one semiconductor component, and a contact-pressure device which exerts a force on the substrate locally and via the at least one semiconductor component such that the substrate is pressed against the cooling device.

6 Claims, 2 Drawing Sheets

POWER SEMICONDUCTOR ARRANGEMENT

PRIORITY

This application claims priority from German Patent Application No. 102004018476.3, which was filed on Apr. 16, 2004, and is incorporated herein by reference in its entirety.

TECHNICAL FIELD OF THE INVENTION

The present invention generally relates to a power semiconductor arrangement.

DESCRIPTION OF RELATED ART AND BACKGROUND OF THE INVENTION

Power semiconductor modules such as those known from DE 199 42 915 A1 or DE 101 42 971 A1 have an insulating and thermally conductive mount (substrate) and one or more power semiconductor elements which are arranged on it. These are electrically connected to one another and to contact surfaces or contact elements via metallic conductor tracks which are formed on the upper face of the substrate. The lower face of the substrate, which is likewise metallic and, for example, is copper-coated, is pressed against a heat sink by pressure pieces. The heat sink is used to dissipate the heat which occurs during operation of the power semiconductor module. The power semiconductor modules as described above are frequently referred to as modules without base plates, since there is no intermediate metal plate between the substrate and the heat sink.

When using power modules without a base plate, it is necessary to press the ceramic firmly against the heat sink, since, in contrast to modules with a base plate, there is no mechanically provided heat transfer (metallic base plate). However, previous power semiconductor modules without base plates have been subject to the problem of providing a good thermal contact without in the process damaging the bonding connections which lead away from the semiconductor elements and are provided for making further contact. Owing to the bonding wires, it is not possible to press directly onto the chips in order to achieve the best possible thermal contact between the heat sources (power semiconductor components) and, through the substrate, to the heat sink. The requirement for an adequate thermal contact with the heat sink and the fact that pressure can be exerted on the substrate only at specific points frequently lead to considerable restrictions in the use of such power semiconductor modules.

In the known power semiconductor modules, points are kept free in the area surrounding the semiconductor components on the substrate, at which pressure is applied to the substrate by means of stamps or spring contacts. In this case, small stamps, pins, etc. press onto the substrate. Since the free area is, however, restricted, an optimum must therefore always be found between the electrically usable area and the area which is required for fitting the pressure contact surfaces. The disadvantage in this case is the area required for the pressure points and the fact that pressure cannot be applied directly at the actual points which require good thermal contact, since they are provided with bonding wires. DE 199 03 875 discloses an arrangement in which a specific form of pressure contact is provided instead of bonding wires. However, this is very complex, is also subject to defects in certain applications, and can be used only for a limited range of applications.

SUMMARY OF THE INVENTION

The object of the invention is therefore to specify a power semiconductor arrangement which allows better heat dissipation from the power semiconductor components, with less complexity.

The object can be achieved by a power semiconductor arrangement comprising an electrically insulating and thermally conductive substrate, which is provided with a structured metallization on at least one side, a cooling device which is in thermal contact with the other side of the substrate, at least one semiconductor component which is arranged on the substrate and which is electrically connected to the structured metallization, an entirely or partially electrically insulating film which is arranged at least on that side of the substrate at which the at least one semiconductor component is placed, and which is laminated without any cavities onto the substrate including or excluding the at least one semiconductor component, and a contact-pressure device which exerts a force on the substrate locally and via the at least one semiconductor component such that the substrate is pressed against the cooling device.

The contact-pressure device may have an elastic element which produces the force for pressing against the substrate. The contact-pressure device may also have a rigid element which is arranged between the elastic element and the at least one semiconductor component. The contact-pressure device can be supported on the cooling device. The laminated-on film may extend over at least one semiconductor component and the contact-pressure device may exert a force on the substrate via the film and the at least one semiconductor component. The laminated-on film may have a cutout in the area of the at least one semiconductor component and the contact-pressure device exerts a force on the substrate through the cutout and via the at least one semiconductor component. The contact-pressure device can also be provided in order to make electrical contact with the semiconductor component. The contact-pressure device can also be provided for heat dissipation from the semiconductor component. The contact-pressure device also may exert a force on the substrate at points other than the points which have semiconductor components. The substrate may have a metallization on the side facing the cooling device. The at least one semiconductor component may have first protective metallization on its side facing away from the heat sink. The at least one semiconductor component may have a second protective metallization on its side facing away from the heat sink, which second protective metallization is arranged on the side of the first protective metallization facing away from the at least one semiconductor component.

According to the invention, the use of a film lamination technique rather than a bonding technique for making contact with the connecting surfaces of power semiconductor elements results in large-area contact surfaces, for which provision is now made for pressure to be exerted on them directly by stamps, pins, etc., so that the semiconductor components achieve the maximum thermal contact, and a good thermal contact is thus achieved exactly at the point at which the heat is produced. Optimum heat dissipation can thus be achieved by pressing against the hottest points on the module.

In detail, a power semiconductor arrangement according to the invention has an electrically insulating and thermally conductive substrate, which is provided with structured metallization on at least one side. Any desired organically or inorganically based circuit mounts may be used as the substrates. Substrates such as these are, for example, of PCB (printed circuit board), DCB (direct copper bonding), IM (insulated metal), HTCC (high temperature co-fired ceramics) and LTCC (low temperature co-fired ceramics). These substrates have metallization composed, for example, of copper or aluminum on at least one side. The side of the substrate on which the power semiconductor elements are arranged in this case preferably has structured metallization (for example, conductor tracks) for making contact between the power semiconductor elements and with other components and contact elements.

A cooling device, such as a heat sink, a cold block or a cold plate, is provided on the other side of the substrate and is in thermal contact with the substrate. The cooling device is used to dissipate heat directly from the substrate, and thus indirectly from components arranged on the substrate.

At least one semiconductor component is provided as the component, is arranged on the side of the substrate facing away from the cooling device, and is electrically connected to the structured metallization. An entirely or partially electrically insulating film extends over a large area over the at least one semiconductor component and over further components, contact elements as well as free points on the substrate and is secured over a large area and without any cavities to the substrate, to the structured metallization, to the at least one semiconductor component and, possibly, to further elements which are arranged on the substrate, by being laminated on. As already mentioned, this film may be used on the one hand, exclusively for insulation, but on the other hand, may also be provided with line structures such as conductor tracks, conductor surfaces or the like, so that it acts like a flexible printed circuit. In this case, the conductor tracks may be composed of metal, or conductive plastic. Furthermore, a composite of two or more films may also be used, that is to say two or more layers of films and metallizations, etc. one above the other, in which case the layers may, in any desired sequence and configuration be electrically insulating, and/or partially electrically conductive, or completely electrically conductive.

Finally, according to the invention a contact-pressure device is provided, which exerts a force on the substrate via the at least one semiconductor component, such that the substrate is pressed against the cooling device. The contact-pressure device and the cooling device are thus arranged such that all of the elements which are arranged between them, that is to say the semiconductor components, components, contact elements, films, substrate etc., are pressed together, thus allowing heat dissipation to the heat sink. This is particularly important with regard to the at least one semiconductor component, which represents the major heat source in power semiconductor arrangements.

The contact-pressure device may in this case have an elastic element which provides the force for pressing against the substrate. By way of example, springs or resilient elements, cushions composed of elastic material or the like may be used as elastic elements. In this case, the elastic element can act directly on the desired point, or else indirectly by means of a rigid element. Such rigid elements are, for example, pins, stamps, blocks or other elements which are suitable for the transmission and introduction of pressure at the desired points. Resilient or rigid, preferably electrically insulating, clips, housings or housing parts or other supporting structures (composed of plastic by way of example) may be used to support the contact-pressure device on the cooling device and, by way of example, these may be screwed, clipped, hooked, riveted, pressed, welded or adhesively bonded to the heat sink.

The film or films may either extend over the at least one semiconductor component or else may have a cutout in the area of the at least one semiconductor component, in which case the contact-pressure device then, depending on the situation, acts indirectly (via the film or films) or directly, that is to say with nothing interposed, on the semiconductor components.

For the situation where the contact-pressure device makes direct contact with the semiconductor component, it is also possible to provide for the contact-pressure device also to be provided in order to dissipate heat from and/or to make electrical contact with the at least one semiconductor component.

The forces which are produced by the contact-pressure device result in contact-pressure forces on the at least one semiconductor component. In order to prevent destruction of the semiconductor components and to distribute the contact-pressure forces uniformly, the semiconductor component may be provided with protective metallization on its side facing the contact-pressure device, in particular on the contact surfaces. The protective metallization is preferably in the form of an aluminum layer with a thickness of preferably 3 µm, as well as a copper layer which is arranged on the aluminum layer, with a thickness of preferably 200 µm.

The protective metallization may be arranged entirely or partially both underneath the film or films or in the areas of the film or films in which the film or films has or have been opened.

The contact-pressure device may, however, also be used to press free points on the substrate, other components or contact elements against the cooling device, if necessary.

In order to achieve good heat transfer between the substrate and the cooling device, the substrate may advantageously have complete or partial metallization, for example, with copper or aluminum.

BRIEF DESCRIPTION OF THE DRAWINGS

The invention will be explained in the following text with reference to the exemplary embodiments which are illustrated in the figures of the drawing, in which.

DETAILED DESCRIPTION OF PREFERRED EMBODIMENTS

Figure 1:
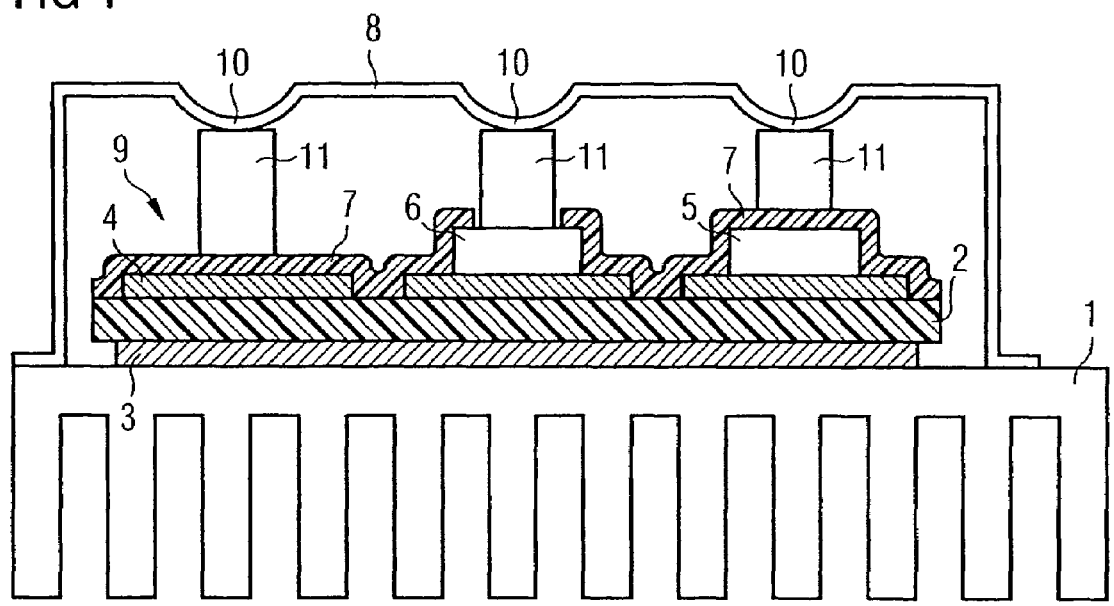
FIG. 1 shows a first general embodiment of a power semiconductor arrangement according to the invention.

In the exemplary embodiment shown in FIG. 1, a substrate 2 is fitted to a heat sink 1 which is used as a cooling device and has cooling ribs, and the substrate has continuous metallization 3 (for example copper or aluminum metallization) on its side facing the heat sink 1. The other side of the substrate 2 has structured metallization 4, to which two semiconductor components 5 and 6 are connected by means of soldering, adhesive bonding or by means of a low-temperature sintering technique. A film 7 is laminated onto the substrate 2 over the semiconductor components 5 and 6 and over the structured metallization 4, with the film 7 having a cutout over the semiconductor component 6.

During the production of an arrangement such as this, the film 7 is first of all laminated, preferably over the entire area as a closed layer, onto that side of the substrate 2 which faces away from the heat sink 1, on to the structured metallization 4 and onto the semiconductor chips 5, 6 and, possibly, onto further elements arranged on the substrate. The film 7 thus follows the surface contour of the substrate 2 with the structured metallization 4 on it, the semiconductor chips 5, 6 and the further elements, if appropriate, so that no cavities remain underneath the film on its side facing the heat sink 1.

A resilient clip 8 is attached in an insulated form to the heat sink 1 over the arrangement mentioned above, in such a way that a specific separation is provided between the clip 8 and the uppermost layer of the arrangement of the laminated-on film 7.

The clip 8 is designed to be resilient and has formed-out areas, pointing towards the substrate 2, at those points which are opposite the semiconductor components 5, 6 as well as a point 9 which is opposite only the point on the substrate 2 with the metallization 4. Metal stamps 11 of appropriate length are inserted between the formed-out areas 10 and the point 9 or the semiconductor components 5 and 6, and rigidly transmit the spring force, that is produced by the clip 8, to the point 9 and to the semiconductor components 5 and 6. This results in the substrate 2 being pressed against the heat sink 1, in particular at the appropriate points. The actual heat source is thus itself indirectly pressed, via the substrate, against the heat sink in the case of the semiconductor components 5 and 6, thus resulting in better heat dissipation. The introduction of the force at the point 9, in contrast, is intended purely for general stabilization and securing of the substrate 2.

Since, in the present case, the stamps are manufactured entirely from metal, these can, on the one hand, likewise absorb heat and, for example, pass it to the clip 8, and, on the other hand, can also make electrical contact with the semiconductor component 6, since the semiconductor component 6 is not covered by the film 7. The connecting clip 8 is thus also used as an electrical busbar.

On the side of the semiconductor components 5, 6 on which the force is introduced to the semiconductor components 5, 6, the semiconductor components 5, 6 may be provided with protective metallization in order to distribute the forces that occur as uniformly as possible, and to protect the semiconductor components 5, 6 against destruction.

FIGS. 2 to 5 show various embodiments of contact-pressure devices, in each case, for the sake of simplicity, being based on only a single semiconductor component 12, which is mounted on the metallization 13 of a substrate 14. The substrate 14 is metallized on only one side, and its other side makes contact with a heat sink 15. A film 15 is laminated over the arrangement comprising the substrate 14, the metallization 13 and the semiconductor component 12, with the film having a cutout over the semiconductor component 12 in the exemplary embodiments shown in FIGS. 3 and 5.

Figure 2:
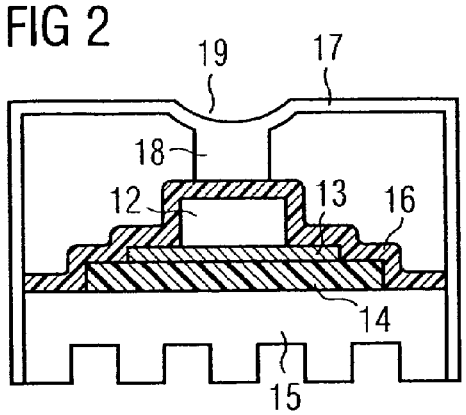
FIG. 2 shows a first alternative embodiment of a contact-pressure device for a power semiconductor module according to the invention.

In the exemplary embodiment shown in FIG. 2, a housing cover 17 is provided which, by way of example, is made of plastic, and, in the area of the semiconductor component 12, has a formed-out area which points towards it and has an integrally formed stamp 18. The housing cover 17 itself is elastic and is also held relatively elastically in the area of the formed attachment on the stamp 18, by means of a cross-section taper 19.

On the side facing away from the substrate 14, the semiconductor component 12 has a first, optional protective metallization layer 26 composed of aluminum, as well as a second optional protective metallization layer 27 composed of copper. The protective metallization layers 26, 27 are arranged between the stamp 18 and the semiconductor component 12, as well as underneath the film 16.

Alternatively, the film 16 may also have an opening, so that the stamp 18 presses directly against the uppermost of the protective metallization layers 26, 27.

Figure 3:
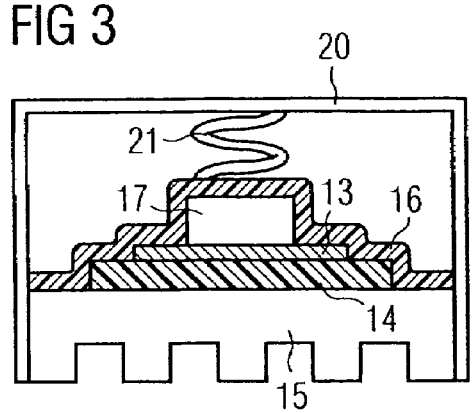
FIG. 3 shows a second alternative embodiment of a contact-pressure device for a power semiconductor module according invention.

In the exemplary embodiment shown in FIG. 3, a rigid cover 20, composed of metal, is used. One helical spring is supported against this cover 20, while its other end presses directly on the semiconductor element 12, so that the latter is once again pressed via the substrate 14 against the heat sink 15 in order to dissipate heat from the semiconductor component 12. Since the helical spring 21 and the housing cover 20 are manufactured from metal, both of them can be used in a similar manner to that in the exemplary embodiment shown in FIG. 1 in order to make contact with the semiconductor component 12.

In this exemplary embodiment as well, the semiconductor component 12 has a first optional protective metallization layer 26 composed of aluminum on its side facing away from the substrate 14, as well as a second optional protective metallization layer 27 composed of copper. The protective metallization layers 26, 27 are arranged between the spring 21 and the semiconductor component 12, as well as underneath the film 16.

Alternatively, the film 16 may also have an opening, so that the spring 21 presses directly on the uppermost of the protective metallization layers 26, 27.

Figure 4:
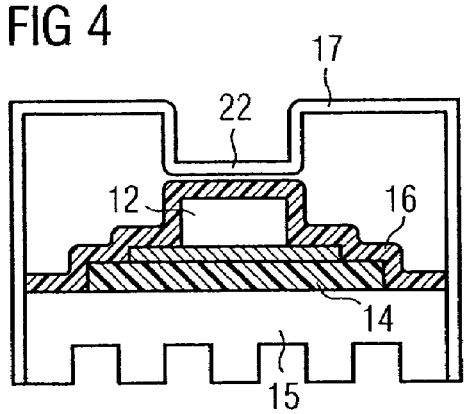
FIG. 4 shows a third alternative embodiment of a contact-pressure device for a power semiconductor module according to the invention.

The exemplary embodiment shown in FIG. 4 is based on the exemplary embodiment shown in FIG. 2 by the formed-out area in the area of the semiconductor component 12 being in the form of a hollow cylinder, forming a base section 22. This base section 22 is, in the present case, used for pressing directly on the film 16 and, via this, indirectly, on the semiconductor component 12. The force is in this case produced by the elasticity of the cover 17, which is manufactured from plastic.

In this case, as well, the semiconductor component 12 has a first optional protective metallization layer 26 composed of aluminum on its side facing away from the substrate 14, as well as a second optional protective metallization layer 27 composed of copper. The protective metallization layers 26, 27 are arranged between the base section 22 and the semiconductor component 12, as well as underneath the film 16.

Alternatively, the film 16 may also have an opening, so that the base section 22 presses directly against the uppermost of the protective metallization layers 26, 27. In this case, the lateral dimensions of the base section 22 are preferably chosen such that the base section 22 fits into the opening in the film 16.

Figure 5:
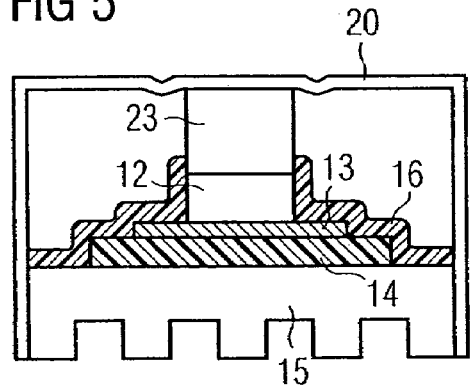
FIG. 5 shows a fourth alternative embodiment of a contact-pressure device for a power semiconductor module according invention.

Finally, the exemplary embodiment shown in FIG. 5 is based on the exemplary embodiment shown in FIG. 3, with the helical spring 21 being replaced by an electrically conductive, elastic rubber cushion 23.

An arrangement such as this makes it possible for the semiconductor component 12 to make electrical contact with the rubber cushion 23. For this purpose, the film has an opening above the semiconductor component 12, in which opening the rubber cushion 23 engages, and makes contact with the semiconductor component 12.

On its side facing away from the substrate 14, the semiconductor component 12 has a first optional protective metallization layer 26 composed of aluminum, as well as a second optional protective metallization layer 27 composed of copper. The protective metallization layers 26, 27 are arranged between the rubber cushion 23 and the semiconductor component 12.

The arrangements mentioned above may be modified in any desired way and may also be used for any desired power semiconductor arrangements with regard to passive components, active control elements (for example integrated circuits) as well as contact elements and elements which carry electrical power. Insulating, partially insulating, completely conductive films and film composites formed from them including metal layers may be used in the same way in this case. Polyimide, polyethylene, polyphenol, polyetherketone and/or epoxy material are preferably used as the material for the insulating films or the insulating part of films. The lamination process can be carried out under pressure or in a vacuum and at room temperature, or preferably at higher temperatures in special lamination chambers.

Large-area contact surfaces can be produced by producing a photographic technique to make contact with the connecting surfaces. According to the invention, provision is now made in this case for pressure to be exerted on the entire arrangement directly by stamps or pins on these areas. Contact surfaces may have an optional first protective metallization layer composed of aluminum, as well as a likewise optional second protective metallization layer composed of copper.

It is particularly advantageous in this case that it is possible to exert a contact pressure directly via the power semiconductor component by means of a stamp, a spring, a pin or the like and thus to ensure a very good thermal connection exactly at the point at which the heat is produced in the area of the power semiconductor component. Optimum heat dissipation can thus be achieved by pressing exactly on the hottest points of the power semiconductor module produced in this way. Furthermore, the pressing stamp may also be used as a heat dissipation means. Depending on the form of an insulation layer, the stamp may just carry out the function of a pressure stamp, or else additionally act directly as an electrical current connection with the insulation being omitted. In addition, this measure further improves the heat dissipation.

In all of the exemplary embodiments shown in FIGS. 1 to 5, the contact-pressure device produces a contact-pressure force which acts indirectly or directly on the semiconductor components 5, 6, 12. The contact-pressure force preferably acts only locally on each of the semiconductor components 5, 6, 12, that is to say in the lateral direction, the semiconductor components 5, 6, 12 are adjacent to sections of the substrate and of the structured metallization 4, 13 located on it, on which no contact-pressure force acts.

If the force is transmitted indirectly, the force is transmitted by a force transmission means. By way of example, the metal stamp 11 as shown in FIG. 1, the stamp 18 as shown in FIG. 2, the spiral spring 21 as shown in FIG. 3, the base section 22 as shown in FIG. 4 or the rubber cushion 23 as shown in FIG. 5 are suitable as force transmission means.

According to one preferred embodiment of the invention, in each case at most one, and preferably one and only one force transmission means press onto each of the semiconductor components 5, 6, 12 as shown in FIGS. 1 and 2 to 5, respectively.

In this case, each force transmission means preferably presses against at most one of the semiconductor components 5, 6 or onto at most one of the points 9, as shown in FIG. 1, or onto at most one of the semiconductor components 12, as shown in FIGS. 2 to 5. Furthermore, in all of the exemplary embodiments shown in FIGS. 1 to 5, the semiconductor components are preferably connected to the substrate and/or to the structured metallization on it by soldering, adhesive bonding or by means of a low-temperature sintering technique.

I claim:

1. A power semiconductor arrangement comprising an electrically insulating and thermally conductive substrate, which is provided with a structured metallization on at least one side, a cooling device which is in thermal contact with the other side of the substrate, at least one semiconductor component which is arranged on the substrate and which is electrically connected to the structured metallization and has first protective metallization on its side facing away from the cooling device, an entirely or partially electrically insulating film which is arranged at least on that side of the substrate at which the at least one semiconductor component is placed, and which is laminated without any cavities onto the substrate including the at least one semiconductor component, and a contact-pressure device which exerts a force on the substrate locally and via the at least one semiconductor component such that the substrate is pressed against the cooling device, wherein the film extends over the at least one semiconductor component and the contact-pressure device exerts a force on the substrate via the film and the at least one semiconductor component and wherein the contact-pressure device has an elastic element which produces the force for pressing against the substrate and a rigid element arranged between the elastic element and the at least one semiconductor component.

2. The power semiconductor arrangement as claimed in claim 1, wherein the contact-pressure device is supported on the cooling device.

3. The power semiconductor arrangement as claimed in claim 1, wherein the contact-pressure device is also provided for heat dissipation from the semiconductor component.

4. The power semiconductor arrangement as claimed in claim 1, wherein the substrate has a metallization on the side facing the cooling device.

5. The power semiconductor arrangements as claimed in claim 1, wherein the at least one semiconductor component has a second protective metallization on its side facing away from the cooling device, which second protective metallization is arranged on the side of the first protective metallization facing away from the at least one semiconductor component.

6. A power semiconductor arrangement comprising an electrically insulating and thermally conductive substrate comprising a structured metallization on at least one side, a cooling device in thermal contact with the other side of the substrate, at least one semiconductor component arranged on the substrate and electrically connected to the structured metallization and which has first protective metallization on its side facing away from the cooling device, an entirely or partially electrically insulating film arranged at least on that side of the substrate at which the at least one semiconductor component is placed, and laminated without any cavities onto the substrate including the at least one semiconductor component, and a contact-pressure device for exerting a force on the substrate locally and via the at least one semiconductor component such that the substrate is pressed against the cooling device and wherein the contact-pressure device is supported on the cooling device, has an elastic element which produces the force for pressing against the substrate and has a rigid element which is arranged between the elastic element and the at least one semiconductor component, wherein the film extends over the at least one semiconductor component and the contact-pressure device exerts a force on the substrate via the film and the at least one semiconductor component.

* * * * *